US010332931B2

United States Patent
Cassidy et al.

(10) Patent No.: US 10,332,931 B2
(45) Date of Patent: Jun. 25, 2019

(54) SEMICONDUCTOR DEVICE FOR WAFER-SCALE INTEGRATION

(71) Applicant: ams AG, Unterpremstaetten (AT)

(72) Inventors: Cathal Cassidy, Okinawa (JP); Joerg Siegert, Graz (AT); Franz Schrank, Graz (AT)

(73) Assignee: ams AG, Unterpremstaetten (AT)

( * ) Notice: Subject to any disclaimer, the term of this patent is extended or adjusted under 35 U.S.C. 154(b) by 6 days.

(21) Appl. No.: 15/455,055

(22) Filed: Mar. 9, 2017

(65) Prior Publication Data

US 2017/0179183 A1   Jun. 22, 2017

Related U.S. Application Data

(62) Division of application No. 14/401,499, filed as application No. PCT/EP2013/057219 on Apr. 5, 2013, now Pat. No. 9,608,035.

(30) Foreign Application Priority Data

May 15, 2012   (EP) .................................... 12168069

(51) Int. Cl.
  *H01L 27/146*   (2006.01)
  *H01L 23/00*   (2006.01)
  *H01L 31/0296*   (2006.01)

(52) U.S. Cl.
  CPC .......... *H01L 27/1469* (2013.01); *H01L 24/32* (2013.01); *H01L 24/83* (2013.01); *H01L 27/14634* (2013.01); *H01L 27/14636* (2013.01); *H01L 27/14661* (2013.01); *H01L 27/14663* (2013.01); *H01L 27/14696* (2013.01); *H01L 31/0296* (2013.01); *H01L 31/02966* (2013.01); *H01L 2924/14* (2013.01); *H01L 2924/37001* (2013.01)

(58) Field of Classification Search
  None
  See application file for complete search history.

(56) References Cited

U.S. PATENT DOCUMENTS

| | | | |
|---|---|---|---|
| 7,227,150 | B2 | 6/2007 | Wear |
| 8,120,683 | B1 | 2/2012 | Turner et al. |
| 8,617,911 | B2 | 12/2013 | Onishi |
| 2005/0035381 | A1 | 2/2005 | Holm et al. |
| 2007/0285115 | A1 | 12/2007 | Wood et al. |
| 2008/0265407 | A1 | 10/2008 | Lu et al. |
| 2009/0178275 | A1 | 7/2009 | Dang et al. |
| 2010/0133584 | A1* | 6/2010 | Basu .................. H01L 31/0336 257/184 |

(Continued)

FOREIGN PATENT DOCUMENTS

| | | |
|---|---|---|
| DE | DE-102008048303 B3 | 4/2010 |
| WO | WO-2009072056 A2 | 6/2009 |

*Primary Examiner* — Long Pham
(74) *Attorney, Agent, or Firm* — Fish & Richardson P.C.

(57) ABSTRACT

The semiconductor device comprises a semiconductor wafer with an integrated circuit, formed by a plurality of dies, a further semiconductor wafer, which differs from the semiconductor wafer in diameter and semiconductor material, the semiconductor wafer and the further semiconductor wafer being bonded to one another by means of a bonding layer, and an electrically conductive contact layer arranged on the further semiconductor wafer opposite to the bonding layer.

5 Claims, 3 Drawing Sheets

(56) References Cited

U.S. PATENT DOCUMENTS

2010/0144068 A1   6/2010  Chiou et al.
2012/0043468 A1*  2/2012  Flitsch ................. G01T 1/2018
                                                  250/366

* cited by examiner

SEMICONDUCTOR DEVICE FOR WAFER-SCALE INTEGRATION

CROSS-REFERENCE TO RELATED APPLICATION

This application is a divisional of U.S. application Ser. No. 14/401,499, filed Nov. 14, 2014, which is a national stage application of International Patent Application No. PCT/EP2013/057219, filed Apr. 5, 2013, which claims the benefit of priority to European Patent Application No. 12168069.8, filed on May 15, 2012, all of which are hereby incorporated by reference in their entirety for all purposes.

BACKGROUND OF THE INVENTION

1. Field of the Invention

The invention relates to a new semiconductor device for wafer-scale integration suitable for different wafer sizes.

2. Description of the Related Art

In semiconductor technology a three-dimensional integration of different materials, fabricated with different process technologies and with different functionality (e.g. sensor/CMOS, memory/processor), may raise difficulties when the available wafer sizes of the desired process technologies do not match (e. g. 200 mm CMOS with 100 mm compound semiconductor wafers; or 300 mm digital processor with 200 mm analog circuits). Furthermore, yield losses may be increased by methods of wafer-scale integration, because it is not possible to select dies at wafer-scale ("known good die" filtering, KGD).

Methods of placing or bonding semiconductor dies onto carrier wafers are described in U.S. 2007/285115 A1, U.S. 2008/265407 A1, U.S. 2009/178275 A1, and U.S. 2010/144068 A1, for example.

DE 10 2008 048 303 B3 and WO 2009/072056 A2 describe methods of integration of CMOS circuits with direct x-ray conversion materials. These methods use solder joints or wire-bonds to make the necessary connections.

U.S. Pat. No. 7,227,150 B2 describes a conventional method of applying a bias voltage to a cathode contact by wire bonding.

SUMMARY OF THE INVENTION

The semiconductor device comprises a semiconductor wafer with an integrated circuit, formed by a plurality of dies, a further semiconductor wafer, which differs from the semiconductor wafer in diameter and semiconductor material, the semiconductor wafer and the further semiconductor wafer being bonded to one another by means of a bonding layer, an electrically conductive contact layer arranged on the further semiconductor wafer opposite to the bonding layer, and an electrically conductive layer, which may be metal, forming a through-wafer via connecting the contact layer with the integrated circuit.

In an embodiment of the semiconductor device the further semiconductor wafer comprises cadmium telluride or cadmium zinc telluride.

In a further embodiment the semiconductor wafer comprises silicon, and the further semiconductor wafer comprises a semiconductor material for x-ray conversion.

In a further embodiment the semiconductor wafer is less than 300 µm thick, and the further semiconductor wafer is at least 300 µm thick.

A further embodiment comprises electrically conductive contact pads between the semiconductor wafer and the further semiconductor wafer, and further electrically conductive layers, which may be metal, connecting the contact pads with the integrated circuit.

In a further embodiment the semiconductor wafer is divided into a plurality of dies.

The following is a detailed description of examples of the invention in conjunction with the accompanying drawings.

DETAILED DESCRIPTION OF PREFERRED EMBODIMENTS

Figure 1:
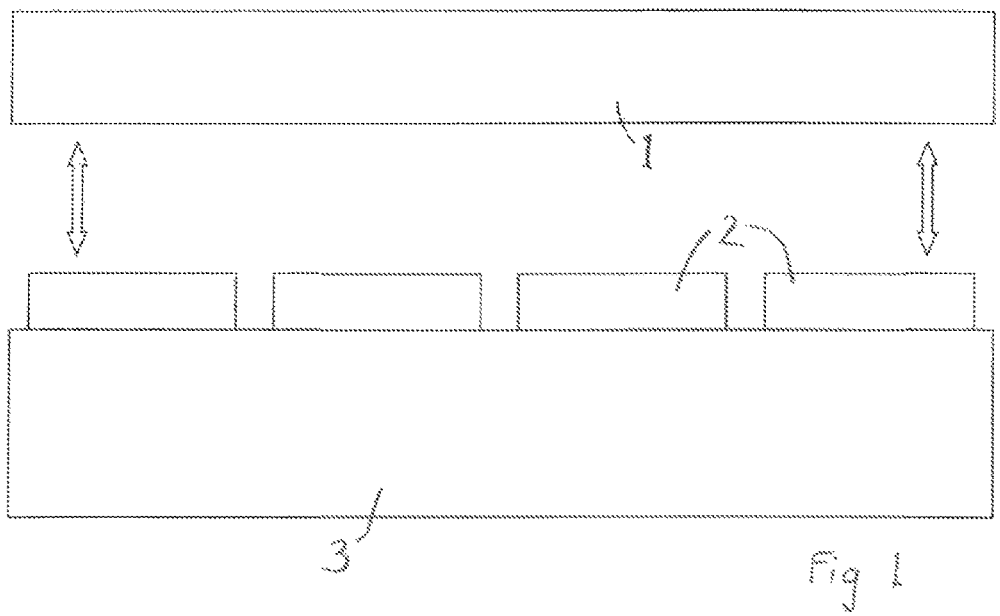
FIG. 1 shows a cross section of an arrangement of the wafers before the semiconductor wafers are bonded.

FIG. 1 shows a cross section of an arrangement of a semiconductor wafer 1, a further semiconductor wafer 2, which differs from the first semiconductor wafer 1 in its size, in its material or in its size and material, and a handling wafer 3. The further semiconductor wafer 2 is fastened to the handling wafer 3. In the embodiment shown in FIG. 1 the further semiconductor wafer 2 has before been divided into dies, which may have been done by any usual method of wafer dicing. The dies may be selected to secure that only "known good dies" are used. The dies are arranged on the handling wafer 3 and permanently fastened to the handling water 3. The further semiconductor wafer 2 may instead be one piece only, or it may be separated into dies after having been fastened to the handling wafer 3. The arrangement of the further semiconductor wafer 2 and the handling wafer 3 is then bonded to the semiconductor wafer 1. For this purpose the semiconductor wafer 1 may be provided with a bonding layer, which may be an oxide of the semiconductor material of the semiconductor wafer 1, for instance.

The described method especially allows three-dimensional integration process technologies to be extended to the use of wafers or dies of different sizes, including different lateral dimensions like the diameter of discs as well as substantially different thicknesses. The method may be applied generally for the integration of devices of different technologies. A typical example of an application is the integration of an analog-to-digital converter in CMOS technology with an x-ray sensor on the basis of cadmium telluride (CdTe) (fabricated on 200 mm and 75 mm wafer sizes, respectively). This is one example of a variety of applications, and the method is not restricted to the mentioned set of materials.

Figure 2:
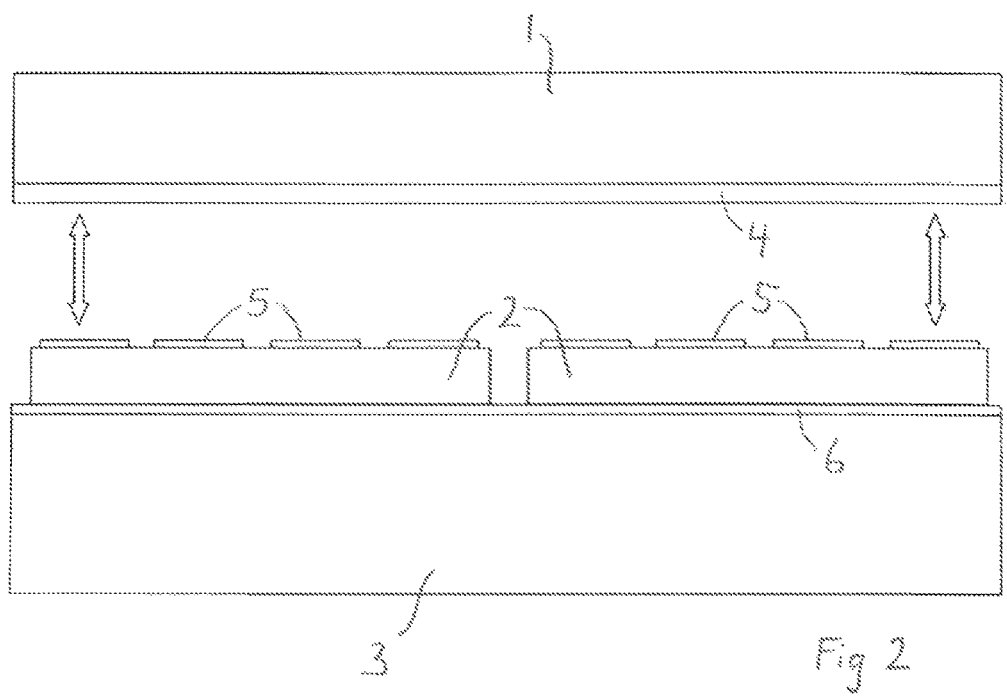
FIG. 2 shows a cross section according to FIG. 1 for another embodiment.

FIG. 2 shows a cross section according to FIG. 1 for an embodiment in which electrically conductive contact pads 5 are arranged between the semiconductor wafer 1 and the further semiconductor wafer 2. An electrically conductive contact layer 6, which can be metal or a highly doped silicon layer, for instance, is arranged between the further semiconductor wafer 2 and the handling wafer 3. The contact layer 6 may especially be applied on the handling wafer 3 before the further semiconductor wafer 2 is fastened to the handling wafer 3. The contact pads 5 are preferably applied before the further semiconductor wafer 2 is fastened to the handling wafer 3. A bonding layer 4, which may be an oxide or any other suitable material, may be applied on a surface of the semiconductor wafer 1, as in the example shown in FIG. 2, or may instead be applied on an upper surface of the arrangement that is formed by the further semiconductor wafer 2 and the handling wafer 3.

Figure 3:
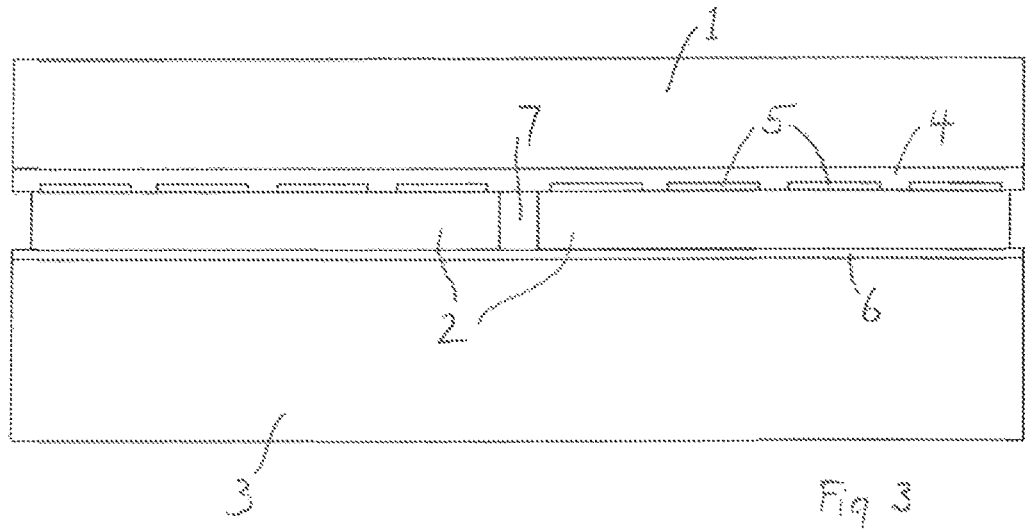
FIG. 3 shows a cross section according to FIG. 2 after the semiconductor wafers are bonded.

FIG. 3 shows a cross section according to FIG. 2 after the semiconductor wafers 1, 2 are bonded. The corresponding elements are designated with the same reference numerals as in FIG. 2. In this embodiment the gaps between the dies of the further semiconductor wafer 2 form a void 7 in the shape of a pattern of trenches. The void 7 may be used to apply an electrical contact to the contact layer 6. There is no void 7 if the further semiconductor wafer 2 is applied without gaps.

Figure 4:
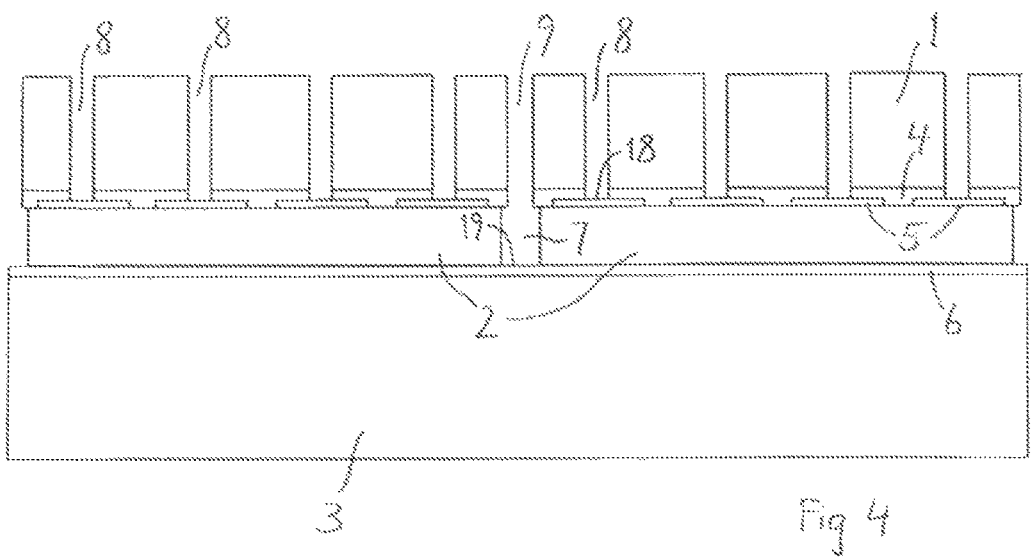
FIG. 4 shows a cross section according to FIG. 3 after the formation of openings in the semiconductor wafers.

FIG. 4 shows a cross section according to FIG. 3 after the formation of openings 8, 9, which may be etched by means of DRIE (deep reactive ion etching), for example, in the semiconductor wafers 1, 2. In the embodiment shown in FIG. 4 these openings 8 are produced in the semiconductor wafer 1 above the contact pads 5 and uncover surface areas 18 of the contact pads 5. At least one further opening 9 is produced above the void 7 and uncovers a surface area 19 of the contact layer 6. If there is no void 7 because the further semiconductor wafer 2 has been applied in one piece, the further opening 9 may be produced in both wafers 1, 2, particularly to form a pattern of trenches, and may thus serve to divide the arrangement of the semiconductor wafer 1 and the further semiconductor wafer 2 into dies. The openings 8, 9 may be used to form through-wafer vias leading from the uncovered areas 18, 19 to the opposite upper surface of the semiconductor wafer 1.

Figure 5:
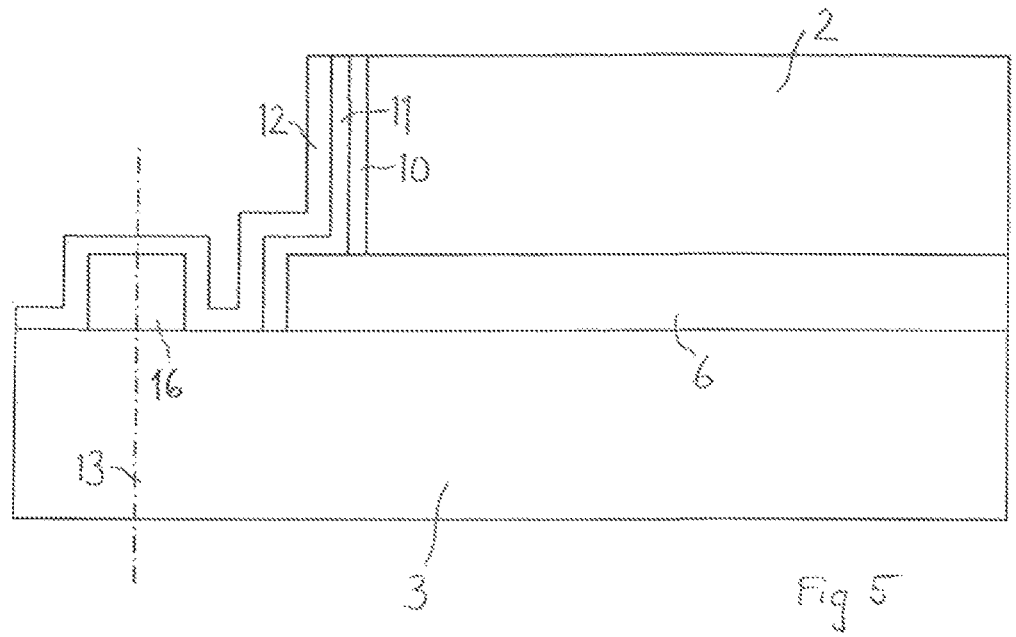
FIG. 5 shows a detail of a cross section according to FIG. 4 after the formation of through-wafer vias.

FIG. 5 shows a detail of a cross section according to FIG. 4 after the formation of through-wafer vias. A sidewall of the further semiconductor wafer 2 is covered with an insulation 10. The through-wafer via is formed on the contact layer 6 by means of a metal layer which may be covered with a passivation layer 12. The contact layer 6 may be structured so that it is interrupted in the void 7. A separated portion 16 of the contact layer may be left. The structure shown in FIG. 5 is especially designed to avoid cracking of the passivation layer 12 in a subsequent wafer dicing process, in which the handling wafer 3 is divided into dies along sawing lines 13.

Figure 6:
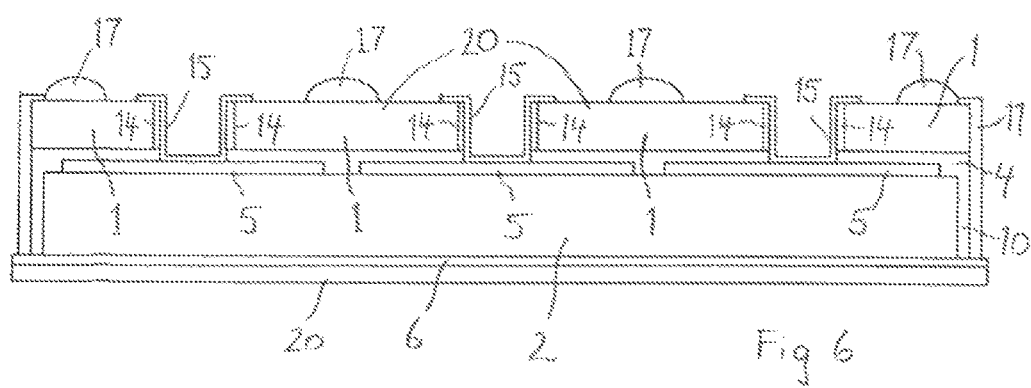
FIG. 6 shows a cross section according to FIG. 4 for a further embodiment after the formation of through-wafer vias.

FIG. 6 shows a cross section according to FIG. 4 for a further embodiment after the formation of through-wafer vias. The corresponding elements are designated with the same reference numerals as in FIG. 4. A metal layer 11 is formed in the opening 9 on sidewalks of the wafers and on the uncovered area 19 of the contact layer 6. The metal layer 11 may be isolated from the semiconductor material by further material of the bonding layer 4, which may additionally be applied on the sidewalks within the opening 9. The metal layer 11 may be connected to upper contacts, like the bump contacts 17 shown in FIG. 6 by way of example, which may be provided as external terminals of integrated circuits 20. Instead of a metal layer 11 another electrically conductive layer may be applied to form the through-wafer vias.

A further insulation 14 may be applied on sidewalk of the semiconductor wafer 1 within the openings 8, and through-water vias may be formed by further metal layers 15 on the uncovered areas 18 of the contact pads 5. The metal layers 15 may also be connected on the upper surface of the semiconductor wafer 1 with terminals of the integrated circuits 20.

The contact pads 5 may thus be provided as a patterned anode contact layer of a sensor device, while the contact layer 6 forms the common cathode contact. The handling wafer 3 may be completely removed or thinned to a remaining layer, which serves as a capping or passivation, as in the embodiment shown in FIG. 6. For applications including a sensor device comprising an x-ray conversion material, a remaining thin layer of silicon is suitable because it is sufficiently transparent to x-radiation. Furthermore the layer may be provided with a high doping concentration rendering it suitable for an external electrical contact for connecting the contact layer 6.

The embodiment according to FIG. 6 is especially favorable if the further semiconductor wafer 2 is provided as a sensor device, particularly a sensor using an x-ray conversion material like CdTe for CT (computed tomography) applications, for example. A CdTe wafer for CT applications typically has a minimum thickness of 300 μm, which is much more than the usual wafer thickness of typically 20 μm used in photodiodes, for instance. A thick wafer, which is to be integrated on a front side with integrated circuit chips, is not easily provided with a backside contact. An application of wire-bond connections to the backside of the exposed sensor is preferably circumvented. The described method of forming a wafer arrangement facilitates a three-dimensional integration of a relatively thick sensor wafer with further semiconductor devices and enables the formation of a direct backside contact.

The invention offers the possibility to integrate devices that are produce by various technologies using wafers of different sizes and/or materials. It enables a three-dimensional integration including a thick sensor water provided with front and rear contacts.

What is claimed is:

1. A semiconductor device comprising:
a semiconductor wafer with an integrated circuit;
a further semiconductor wafer, which differs from the semiconductor wafer in diameter and semiconductor material;
the semiconductor wafer being bonded to the further semiconductor wafer by a bonding layer;
an electrically conductive contact layer arranged on the further semiconductor wafer opposite to the bonding layer; and
an electrically conductive layer connecting the contact layer with the integrated circuit,
wherein openings forming a pattern of trenches divide the semiconductor wafer and the further semiconductor wafer into a plurality of separate dies.

2. The semiconductor device of claim 1, wherein the further semiconductor wafer comprises cadmium telluride or cadmium zinc telluride.

3. The semiconductor device of claim 1 or 2, wherein the semiconductor wafer comprises silicon, and
wherein the further semiconductor wafer comprises a semiconductor material for x-ray conversion.

4. The semiconductor device of claim 1 or 2, wherein the semiconductor wafer is less than 300 μm thick, and
wherein the further semiconductor wafer is at least 300 μm thick.

5. The semiconductor device of claim 1 or 2, further comprising:
electrically conductive contact pads between the semiconductor wafer and the further semiconductor wafer; and further electrically conductive layers connecting the contact pads with the integrated circuit.

\* \* \* \* \*